(12) United States Patent
Tong et al.

(10) Patent No.: US 11,367,594 B2
(45) Date of Patent: Jun. 21, 2022

(54) MULTIZONE FLOW GASBOX FOR PROCESSING CHAMBER

(71) Applicant: Applied Materials, Inc., Santa Clara, CA (US)

(72) Inventors: Mingle Tong, San Jose, CA (US); Li-Qun Xia, Cupertino, CA (US); Daemian Raj Benjamin Raj, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 16/698,480

(22) Filed: Nov. 27, 2019

(65) Prior Publication Data

US 2021/0159053 A1 May 27, 2021

(51) Int. Cl.
*C23C 16/455* (2006.01)
*H01J 37/32* (2006.01)

(52) U.S. Cl.
CPC .. *H01J 37/32449* (2013.01); *H01J 37/32522* (2013.01); *H01J 37/32651* (2013.01); *H01J 2237/332* (2013.01); *H01J 2237/334* (2013.01); *H01J 2237/335* (2013.01); *H01J 2237/3321* (2013.01)

(58) Field of Classification Search
CPC .......... H01J 37/32449; H01J 37/32651; H01J 37/32522; H01J 2237/332; H01J 2237/3321; H01J 2237/335; H01J 2237/334
See application file for complete search history.

(56) References Cited

U.S. PATENT DOCUMENTS

| | | | |
|---|---|---|---|
| 6,415,736 B1 | 7/2002 | Hao et al. | |
| 2002/0078893 A1* | 6/2002 | Os | H01J 37/3244 118/723 I |
| 2003/0221780 A1* | 12/2003 | Lei | C23C 16/45574 156/345.29 |
| 2011/0162800 A1* | 7/2011 | Noorbakhsh | H01J 37/32091 156/345.34 |
| 2019/0252154 A1 | 8/2019 | Samir et al. | |

FOREIGN PATENT DOCUMENTS

| | | |
|---|---|---|
| JP | 2009-117477 A | 5/2009 |
| JP | 2013-239482 A | 11/2013 |
| WO | 02-23964 A1 | 3/2002 |

OTHER PUBLICATIONS

International Search Report and Written Opinion dated Mar. 22, 2021 in International Patent Application No. PCT/US2020/062004, 8 pages.

* cited by examiner

*Primary Examiner* — Yuechuan Yu
(74) *Attorney, Agent, or Firm* — Kilpatrick Townsend & Stockton LLP

(57) ABSTRACT

Exemplary semiconductor processing chambers may include a gasbox characterized by a first surface and a second surface opposite the first surface. The gasbox may define a central aperture. The gasbox may define an annular channel extending about the central aperture. The annular channel may be fluidly accessible from the first surface of the gasbox. The gasbox may further define a plurality of outlet apertures extending from the annular channel through the second surface of the gasbox.

11 Claims, 4 Drawing Sheets

MULTIZONE FLOW GASBOX FOR PROCESSING CHAMBER

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

SUMMARY

Exemplary semiconductor processing chambers may include a gasbox characterized by a first surface and a second surface opposite the first surface. The gasbox may define a central aperture. The gasbox may define an annular channel extending about the central aperture. The annular channel may be fluidly accessible from the first surface of the gasbox. The gasbox may further define a plurality of outlet apertures extending from the annular channel through the second surface of the gasbox.

In some embodiments, the annular channel may include a first zone and a second zone radially outward of the first zone. The gasbox may define a spacer within the annular channel separating the first zone from the second zone. The plurality of outlet apertures may include a first set of outlet apertures providing fluid access from the first zone of the annular channel through the second surface of the gasbox. The plurality of outlet apertures may include a second set of outlet apertures providing fluid access from the second zone of the annular channel through the second surface of the gasbox. The chambers may include a substrate support within the semiconductor processing chamber, and may include a blocker plate positioned between the gasbox and the substrate support. A volume may be defined between the gasbox and the blocker plate, and the volume may be fluidly accessible from the central aperture through the gasbox and from the plurality of outlet apertures of the gasbox. An inlet aperture through the gasbox may be fluidly coupled with one or more conductance paths defined within the gasbox and extending from the inlet aperture through the gasbox to the annular channel. The one or more conductance paths may include a recursive path extending radially outward to the annular channel. The gasbox may define a cooling channel in the first surface of the gasbox extending about the central aperture through the gasbox. The annular channel may be defined within the gasbox between the cooling channel and the second surface of the gasbox.

Some embodiments of the present technology may encompass semiconductor processing chamber gasboxes. The gasboxes may include a first surface and a second surface opposite the first surface. The gasbox may define a central aperture. The gasbox may define an annular channel extending about the central aperture. The annular channel may be fluidly accessible from the first surface of the gasbox through an inlet aperture. The gasbox may define a plurality of outlet apertures extending from the annular channel through the second surface of the gasbox.

In some embodiments, the annular channel may include a first zone and a second zone radially outward of the first zone. The gasbox may define a spacer within the annular channel separating the first zone from the second zone. The plurality of outlet apertures comprise a first set of outlet apertures providing fluid access from the first zone of the annular channel through the second surface of the gasbox. The plurality of outlet apertures may include a second set of outlet apertures providing fluid access from the second zone of the annular channel through the second surface of the gasbox. The inlet aperture through the gasbox may be fluidly coupled with one or more conductance paths defined within the gasbox and extending from the inlet aperture through the gasbox to the annular channel. The one or more conductance paths may include a recursive path extending radially outward to the annular channel. The inlet aperture may provide access to a first bidirectional channel defined in the gasbox. A first distal end of the first bidirectional channel may provide access to a second bidirectional channel. A second distal end of the first bidirectional channel may provide access to a third bidirectional channel. An access aperture may be defined at each distal end of the second bidirectional channel and the third bidirectional channel. Each access aperture may provide fluid access to the annular channel. The gasbox may define a cooling channel in the first surface of the gasbox extending about the central aperture through the gasbox. The annular channel may be defined within the gasbox between the cooling channel and the second surface of the gasbox.

Some embodiments of the present technology may encompass semiconductor processing chambers. The chambers may include a substrate support positioned within a processing region of the semiconductor processing chamber. The chambers may include a gasbox characterized by a first surface and a second surface opposite the first surface. The gasbox may define a central aperture. The gasbox may define an annular channel extending about the central aperture. The annular channel may be fluidly accessible from the first surface of the gasbox. The gasbox may define a plurality of outlet apertures extending from the annular channel through the second surface of the gasbox. The gasbox may define a cooling channel in the first surface of the gasbox extending about the central apertures through the gasbox. The annular channel may be defined within the gasbox between the cooling channel and the second surface of the gasbox. The chambers may include a blocker plate positioned between the gasbox and the substrate support. The chambers may include a faceplate positioned between the blocker plate and the substrate support. In some embodiments the annular channel may include a first zone and a second zone radially outward of the first zone. The gasbox may define a spacer within the annular channel separating the first zone from the second zone.

Such technology may provide numerous benefits over conventional systems and techniques. For example, embodiments of the present technology may allow controlled dilution and distribution of precursors in mid or outer regions of a substrate. Additionally, the chambers and components may allow multiple precursors to be delivered in a number of configurations into a processing region or through a lid stack. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
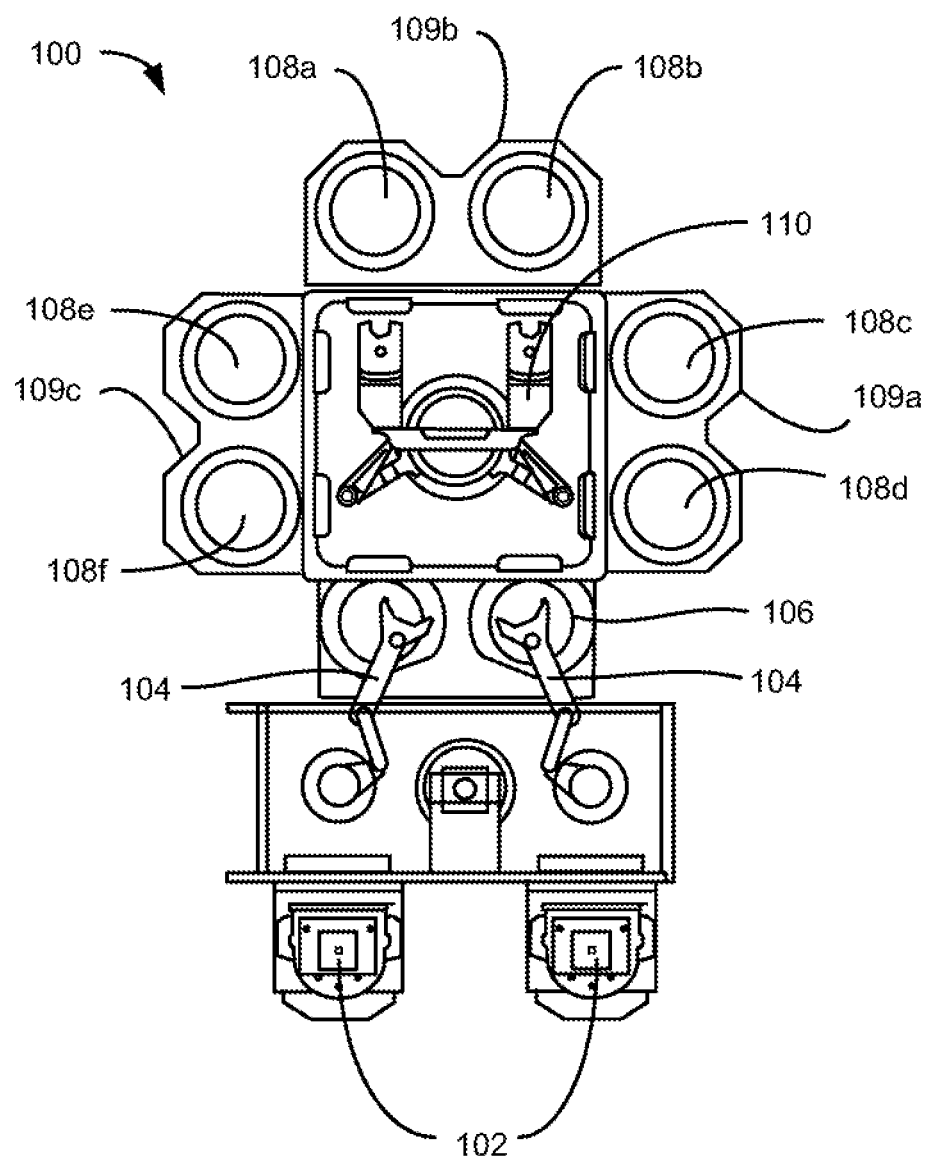
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral uniformity of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film property differences as well as differences across the substrate for materials produced or removed. Adjusting processes at different regions of the substrate, such as for in-plane distortion issues and other film property challenges may be difficult to improve with uniform delivery chamber components, and many conventional technologies have been limited in the adjustments available, or may require specialized components to be produced.

The present technology overcomes these challenges by utilizing one or more chamber components that may facilitate delivery adjustments which may increase or decrease delivery of precursors, such as with dilution, or may afford avenues for material adjustments to the films based on additional precursor inclusion or modulation. Accordingly, improved film formation and removal, as well as improved film properties, may be afforded.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
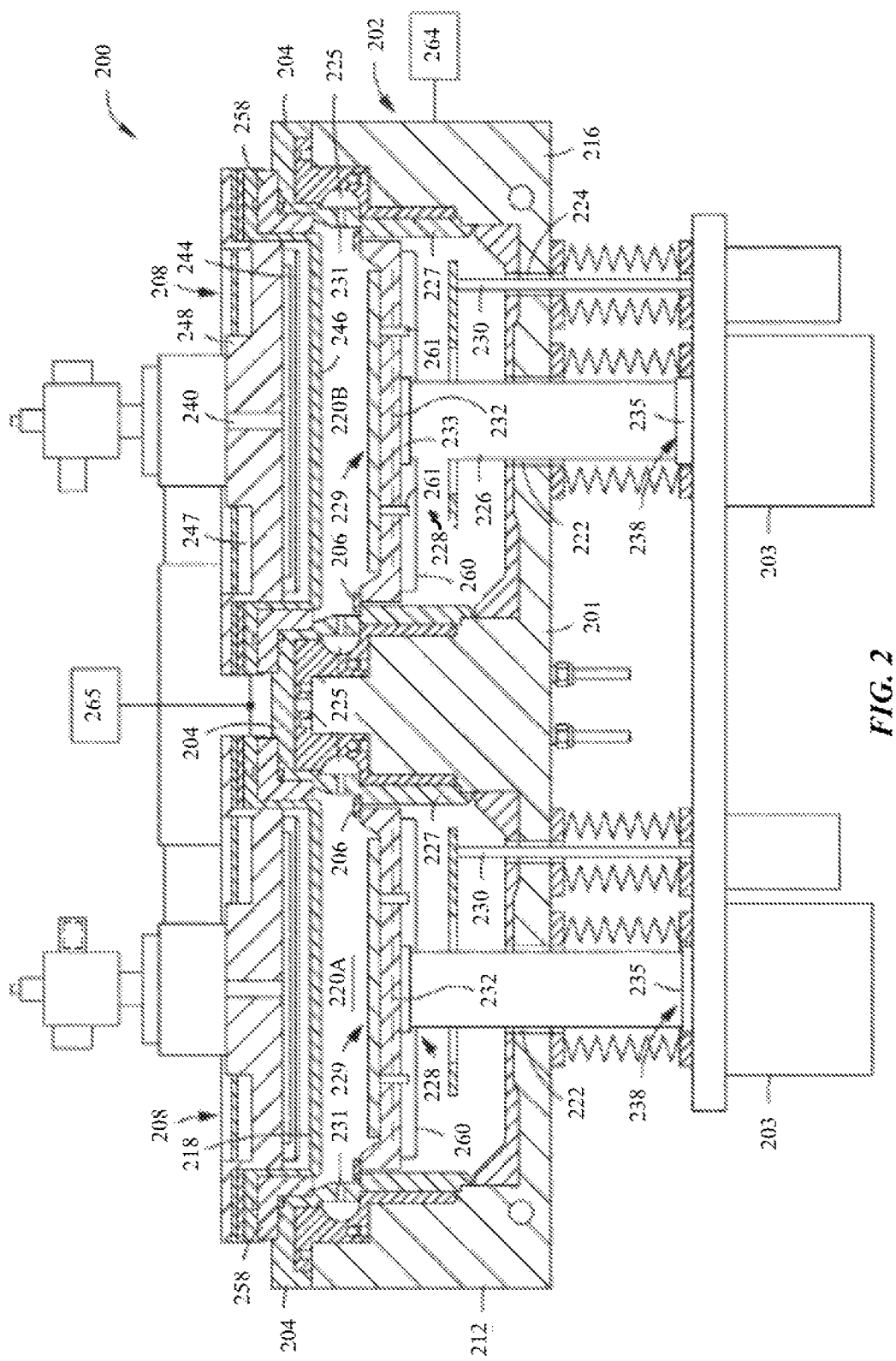
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
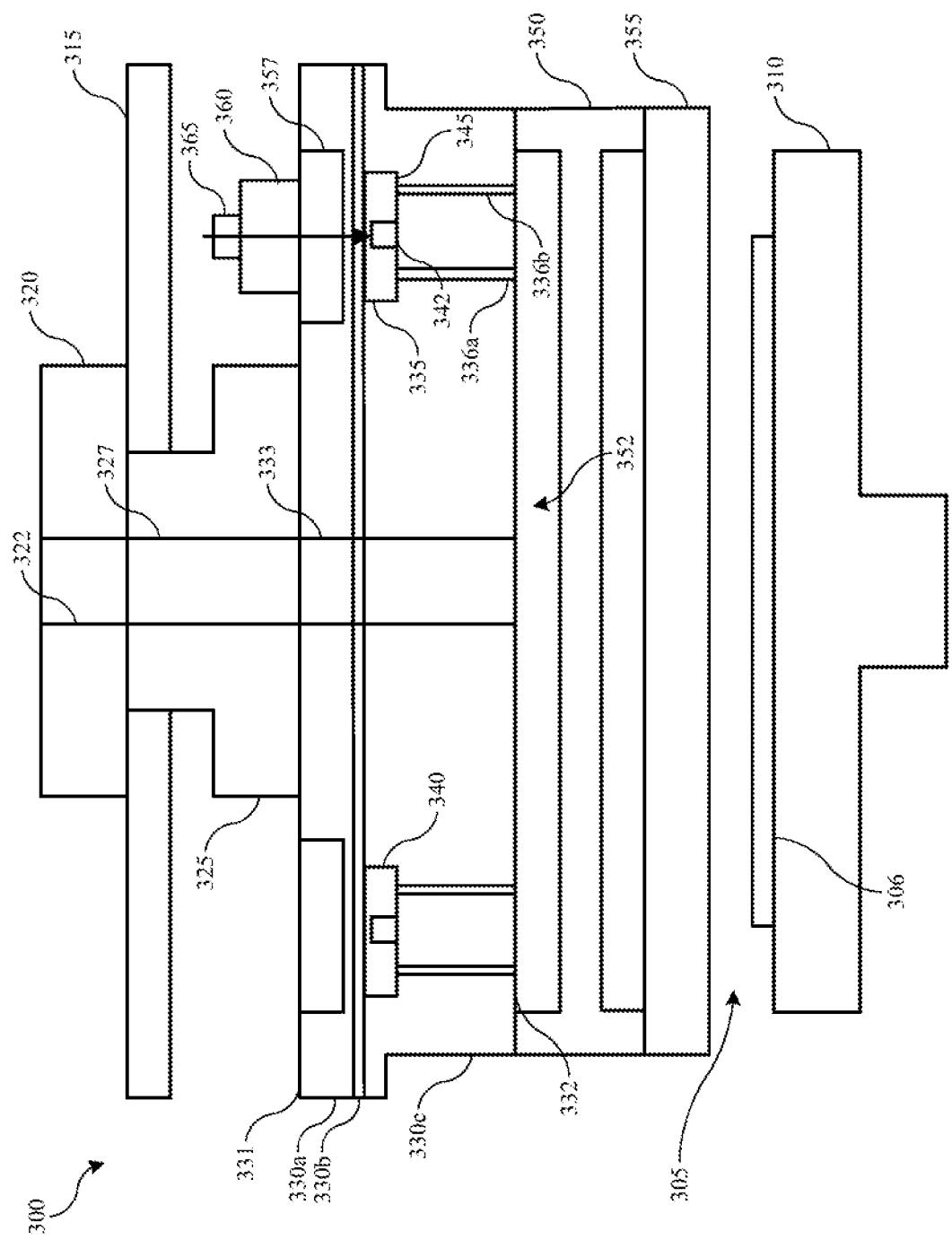
FIG. 3 shows a schematic partial cross-sectional view of an exemplary processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of hardmask materials as previously described, as well as other deposition, removal, and cleaning operations. Chamber 300 may show a partial view of a processing region of a semiconductor processing system, and may not include all of the components, such as a remote plasma unit as illustrated previously, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber into a processing region 305, such as where a substrate 306 may be positioned on a pedestal 310, for example. A chamber lid plate 315 may extend across one or more plates of the lid stack and may provide structural support for components, such as a remote plasma unit illustrated previously for system 200. The lid plate 315 may provide access, such as through an aperture to an internal volume of processing chamber 300. An inlet manifold 320 may be positioned on the lid plate and may provide coupling with a remote plasma unit, which may provide precursors or plasma effluents for chamber cleaning or other processing operations. Inlet manifold 320 may define a central aperture 322, which may extend about a central axis of the chamber or inlet manifold. Processing chamber 300 may also include an insulator 325, which may electrically or thermally separate the inlet manifold from other lid stack components. Insulator 325 may also define a central aperture 327, which may be axially aligned with the central aperture 322 of the inlet manifold 320. Processing chamber 300 may also include a gasbox 330, on which the insulator may be positioned.

Gasbox 330 may be characterized by a first surface 331 and a second surface 332 that may be opposite the first surface. The gasbox may define a central aperture 333, which may extend fully through the gasbox from the first surface to the second surface. The central aperture 333 may be axially aligned with the central aperture of the inlet manifold 320, and may be axially aligned with the central aperture of the insulator 325. The apertures may define a channel, which may be at least partially used to deliver plasma effluents from a remote plasma unit positioned on the inlet manifold. Gasbox 330 may also define one or more channels that may be fluidly accessed through the gasbox, and may allow multiple precursors to be delivered through the lid stack in a variety of flow profiles.

For example, gasbox 330 may define an annular channel 335 extending within the gasbox, and which may be recessed from first surface 331. As will be explained further below, annular channel 335 may be fluidly accessed through an inlet aperture, which may be positioned at any location about the gasbox, and may afford coupling for one or more precursors to be delivered from a gas panel or manifold. The inlet aperture may extend through first surface 331 as illustrated by the arrow, for providing precursors into the gasbox. In some embodiments, annular channel 335 may be concentric with the central aperture 333 of the gasbox. Gasbox 330 may also define one or more outlet apertures 336. Outlet apertures 336 may be defined through the annular channel 335, and may extend from annular channel 335 through second surface 332 of the gasbox. Hence, one or more precursors delivered into annular channel 335 through the gasbox may bypass a remote plasma unit and be delivered to one or more outer regions of the gasbox through the gasbox.

Annular channel 335 may include one or more zones, which may deliver one or more precursors to specific radial sections or areas within the processing region. As illustrated, annular channel 335 may include a first zone 340 and a second zone 345. It is to be understood that although two zones are illustrated, any number of zones may be formed within the gasbox or with the annular channel. Second zone 345 may be formed radially outward of the first zone 340. In some embodiments the two zones may be fluidly isolated from one another and two separate delivery channels, such as two separate inlet apertures, may deliver precursors to the regions. This may provide further tuning between regions on the substrate. Additionally, as illustrated, a spacer 342 may be formed by the gasbox, which may partially extend a thickness of the annular channel 335. Spacer 342 may separate the first zone from the second zone, although the spacer may provide fluid access between the two zones.

When a precursor, or set of precursors, is delivered to annular channel 335, in some embodiments the precursors may be flowed to impinge on an exposed surface of spacer 342. For example, as illustrated by the arrow in the figure, one or more precursors may be flowed and contact an upper surface of spacer 342. The precursors may then flow into the two zones to be distributed about the annular zones. The outlet apertures 336 may be sized to operate as a choke on the fluid flow, which may facilitate annular distribution about the channels, and more uniform flow through the gasbox. This flow may then extend to a blocker plate and faceplate, which may maintain additional or diluted flow, and which may affect deposition, etch, or cleaning operations within the chamber processing region. Some deposition or etch materials may cause non-uniformity at the substrate surface, which may cause profile or film property changes across the substrate. By allowing additional precursor delivery at a radially outward location, additional precursors may be delivered, which may bolster growth, such as by delivering additional processing precursors. Additionally, one or more diluents may be delivered to reduce deposition or etch processes at locations across the substrate.

The plurality of outlet apertures 336 may be distributed in a radial pattern about the gas box, which may follow a general shape or profile of the annular channel. When multiple zones are included, such as illustrated, the outlet apertures may be distributed to facilitate delivery from the zones. For example, a first set of outlet apertures 336a may extend through or be defined by the gasbox to provide fluid access from first zone 340 of the annular channel 335 through the second surface 332 of the gasbox. Additionally, a second set of outlet apertures 336b may extend through or be defined by the gasbox to provide fluid access from second zone 345 of the annular channel 335 through the second surface 332 of the gasbox. In some embodiments a single zone and or set of outlet apertures may be defined by the gasbox. However, when multiple zones are provided, a smoother profile of material delivery or adjustment may be provided.

Gasbox 330 may include additional features. For example, gasbox 330 may define a cooling channel 357, which may allow a cooling fluid to be flowed about the gasbox, and which may allow additional temperature control. As illustrated, the cooling channel 357 may be defined in the first surface 331 of the gasbox 330, and a lid may extend about the cooling channel to form a hermetic seal. Cooling channel 357 may extend about central aperture 333, and may also be concentric with the central aperture. As illustrated, annular channel 335 may be formed or defined within the gasbox between the cooling channel and the second surface of the gasbox. In some embodiments the annular channel may be vertically aligned with the cooling channel, and may be offset from the cooling channel within a depth of the gasbox. To form the annular channel, in some embodiments the gasbox 330 may include one or more stacked plates. The plates may be bonded, welded, or otherwise coupled together to form a complete structure.

For example, gasbox 330 may include at least one plate, and may include two, three, four, or more plates depending on the features formed. As illustrated, gasbox 330 may include two or three plates, which may allow multiple paths to be formed to further distribute precursors towards the annular channel. For example, while plate 330a may include first surface 331 of the gasbox, and plate 330c may include second surface 332 of the gasbox, one or more internal plates 330b may define conductance paths for delivery, which may extend from the inlet aperture to the annular channel. For example, with a single point of delivery, uniformity may be achieved by modulating conductance within the channel relative to the outlet apertures. However, by utilizing one or more conductance paths defined within the gas box, precursors may be delivered to multiple locations within the annular channel, which may increase uniformity of delivery through the gasbox, and may allow larger diameter outlet apertures without sacrificing delivery uniformity. Exemplary conductance paths may be described in more detail below.

Semiconductor processing chamber 300 may also include additional components in some embodiments, such as a blocker plate 350, and a faceplate 355. Blocker plate 350 may define a number of apertures that may operate as a choke to increase radial diffusion to improve uniformity of delivery. Blocker plate 350 may be a first location through the lid stack where precursors delivered to the central aperture of the gasbox and precursors delivered to the annular channel of the gasbox may intermix. As illustrated, a volume 352 may be formed or defined between the gasbox 330 and the blocker plate 350. Volume 352 may be fluidly accessible from both central aperture 333 and the plurality of outlet apertures 336. Precursors delivered into the zone may then at least partially mix or overlap before continuing through the lid stack. By allowing an amount of mixing prior to contacting the substrate surface, an amount of overlap may be provided, which may produce a smoother transition at the substrate, and may limit an interface from forming on a film or substrate surface. Faceplate 355 may then deliver precursors to the processing region, which may be at least partially defined from above by the faceplate.

To provide an additional precursor flow path through the annular channel, additional components may be incorporated to facilitate operation. For example, an isolator 360 may be included to isolate connection components from the gas box. Gasbox 330 may be electrically coupled with faceplate 355, which may be utilized as a plasma-generating electrode. In some embodiments, components of the lid stack may operate as a plasma-generating electrode, such as a hot electrode. Consequently, delivery components, which may be at electrical ground, may benefit from an isolator decoupling associated components from the gasbox. An isolation valve 365 may also be included in the system, and may be included between piping from a gas panel and the chamber. The valve may prevent materials from back streaming into the fluid lines during process operations in which an additional fluid may not be flowed into the processing region through the annular channel.

Figure 4:
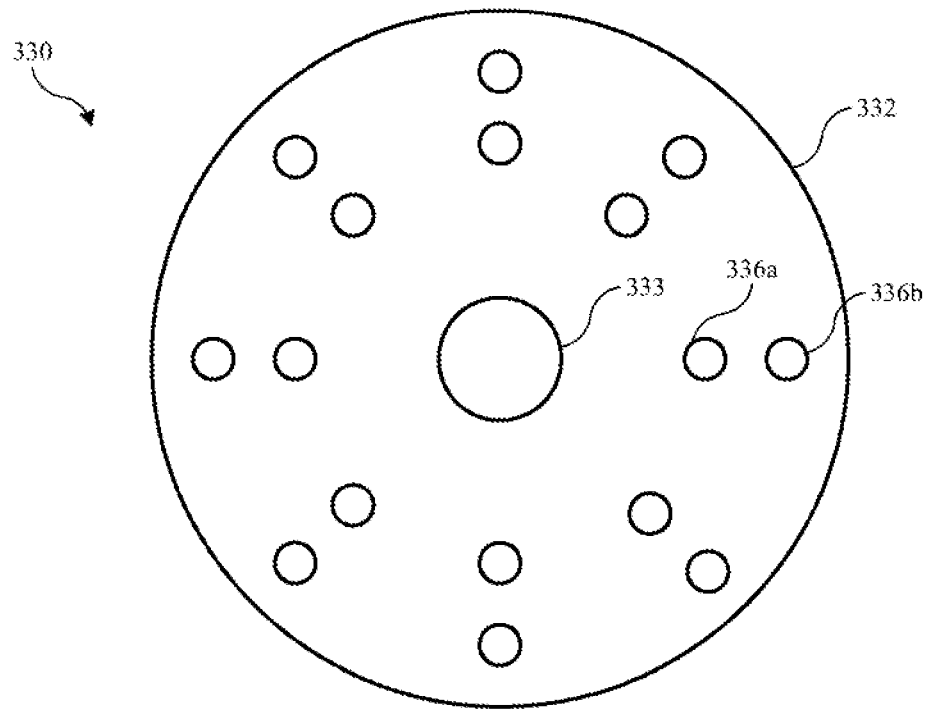
FIG. 4 shows a schematic bottom plan view of an exemplary gasbox according to some embodiments of the present technology.

Turning to FIG. 4 is shown a schematic bottom plan view of an exemplary gasbox 330 according to some embodiments of the present technology. The figure may show additional details of the gasbox to illustrate the fluid delivery from the channels. As previously described, gasbox 330 may be characterized by a first surface, such as facing an inlet manifold, for example. Gasbox 330 may also be characterized by a second surface 332 opposite the first, and which may face a processing region, for example. Gasbox 330 may define a central aperture 333, and may define an annular channel, which may be fluidly coupled with the second surface of the gasbox with outlet apertures 336. As previously described, any number of outlet apertures 336 may extend from the incorporated annular channel through the second surface 332, and which may deliver precursors through the gasbox for distribution to either increase precursor delivery, or dilute precursor delivery in some embodiments as previously described.

The figure includes one exemplary configuration of apertures extending from an annular channel, and is not intended to limit the scope of the present technology. For example, apertures may be staggered between radial rows of apertures, and any number of rows of apertures may be included. Additionally, any number of aperture sizes and variations are similarly encompassed by the present technology. For example, the apertures may all be a uniform size in each row, or apertures may be of varying sizes within a row or between rows in some embodiments. Hence, in one non-limiting example, by including a row of smaller apertures and a row of larger apertures, a smoother transition may be made with delivery and distribution to produce an improved gradient outcome at the substrate. As previously discussed, in some embodiments the annular channel may include multiple zones extending radially inward and/or outward from an inlet aperture. Sets of outlet apertures 336 may be distributed between multiple rows to deliver precursors from each zone of the annular channel. For example, outlet apertures 336a may provide fluid access from an inner radial zone of the annular channel, and outlet apertures 336b may provide fluid access from an outer radial zone of the annular channel. Consequently, a larger radial area may be covered by the added flow, which may limit local radial non-uniformity that may be induced with fewer and/or smaller apertures providing additional precursors.

Figure 5:
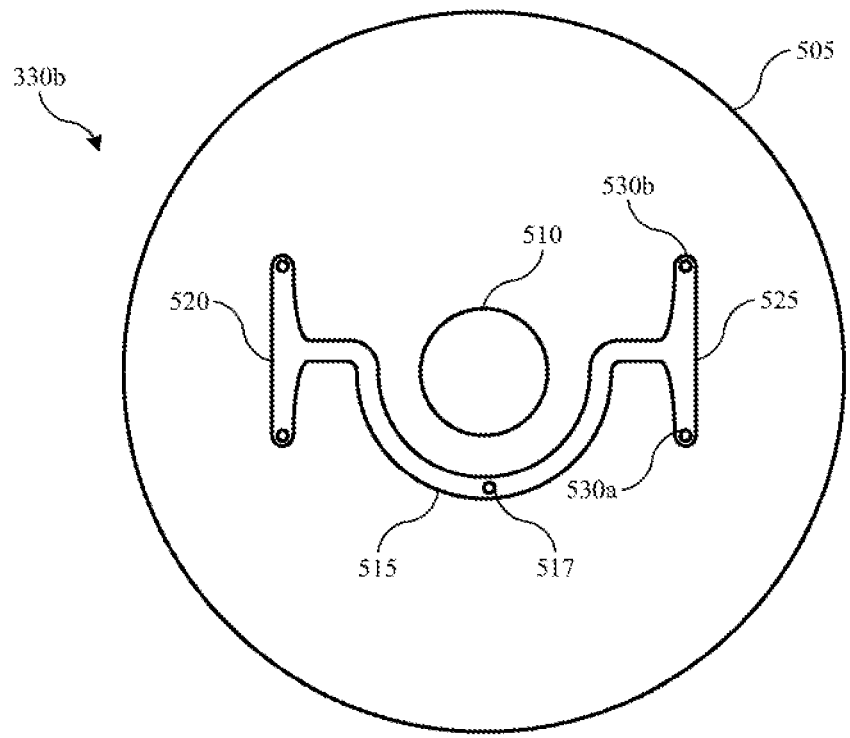
FIG. 5 shows a schematic top plan view of an exemplary gasbox plate according to some embodiments of the present technology.

FIG. 5 shows a schematic top plan view of an exemplary gasbox plate 330b according to some embodiments of the present technology. Gasbox plate 330b may include a middle plate as discussed previously, which may cover an annular channel, or may at least partially define the annular channel from above. In some embodiments plate 330b may be one of only two plates forming a gasbox, and may be one of several plates forming a gasbox. As previously described, in some embodiments, a single inlet aperture may be used to distribute one or more precursors to an annular channel. In some embodiments, additional flow features may be formed within the gasbox, which may increase the number of locations at which precursors may be delivered into the annular channel. The exemplary configuration illustrated is not intended to be limiting to any type of recursive or outwardly extending flow paths for distributing one or more precursors prior to delivering the precursors to the annular channel, and it is to be understood that any number of modifications are similarly encompassed by the present technology.

For example, plate 330b may include an upper surface 505 on which one or more recessed channels may be formed. An overlying plate may seal the channels in some embodiments. Plate 330b may define a central aperture 510, which may at least partially form central aperture 333 of the complete gasbox as previously described. The recessed channels illustrated may show one encompassed example of conductance paths for delivered precursors, and may illustrate a recursive flow path as discussed previously, which may extend radially outward to the annular channel, or may extend in a controlled pattern to radially distribute precursors for multiple positions of delivery into the annular channel. For example, on the upper surface 505 of the plate 330b may be defined a first recessed channel 515. An aperture through an isolator or top cover of the gasbox as described previously may access first recessed channel 515 near a middle or midpoint 517 of the channel, which may allow a delivered precursor to then travel in two directions along the channel. For example, in some embodiments first recessed channel 515 may be a bidirectional channel defined in the plate or gasbox, which may distribute delivered precursors in two directions radially or laterally outward from the position at which the precursors are delivered to the plate.

First recessed channel 515 may extend to two or more distal ends, which may each access an additional bidirectional channel in one embodiment as illustrated, although the channels may extend to more or less channels. As illustrated, the distribution at a first distal end of first recessed channel 515 may provide access to a second recessed channel 520, which may also be a second bidirectional channel as illustrated. Additionally, the distribution at the second distal end of first recessed channel 515 may provide access to a third recessed channel 525, which may also be a third bidirectional channel as illustrated. Although two such additional channels are illustrated, it is to be understood that any number of channels may be included, such as 2, 3, 4, 6, 8, or more channels in embodiments of the present technology.

The second and third channels may have similar or different configurations, and may also be radial or lateral channels in various embodiments. The second recessed channel 520 and the third recessed channel 525 may each distribute from a midpoint where first recessed channel 515 connects with the channel. As illustrated, at the two distal ends of each of the second and third recessed channels may be defined an aperture 530, which may extend to the second surface of plate 330b, which may provide fluid access into an annular channel defined in the gasbox as previously described. Any number of perforations or apertures may be defined to provide more uniform delivery. Although the apertures are shown aligned with an aperture at the opposite distal end of the recessed channel, in some embodiments, apertures 530 may be offset at different radial locations.

For example, in some embodiments, aperture 530a may be positioned to deliver one or more precursors directly into a first zone of the annular channel, and aperture 530b may be positioned to deliver one or more precursors directly into a second zone of the annular channel as previously described. In some embodiments each aperture may be aligned to deliver one or more precursors to impinge on a spacer to distribute precursors between channels as previously described. By including additional precursor delivery paths through lid stacks or components of the present technology, a number of process improvements may be afforded. Wafer film thickness uniformity, material composition, and film properties may be further tuned to improve processes, limit in-plane distortion, and control film properties across the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a gasbox characterized by a first surface and a second surface opposite the first surface, wherein the gasbox defines a central aperture, wherein the gasbox defines an annular channel extending about the central aperture, wherein the annular channel is fluidly accessible from the first surface of the gasbox, wherein the gasbox defines a spacer within the annular channel separating the annular channel into a first zone and a second zone radially outward of the first zone, wherein the gasbox further defines a plurality of outlet apertures extending from the annular channel through the second surface of the gasbox, the plurality of outlet apertures comprising a first set of outlet apertures providing fluid access from the first zone of the annular channel and a second set of outlet apertures radially outward of the first set of outlet apertures providing fluid access from the second zone of the annular channel.

2. The semiconductor processing chamber of claim 1, further comprising:
a substrate support within the semiconductor processing chamber, and
a blocker plate positioned between the gasbox and the substrate support.

3. The semiconductor processing chamber of claim 2, wherein a volume is defined between the gasbox and the blocker plate, and wherein the volume is fluidly accessible from the central aperture through the gasbox and from the plurality of outlet apertures of the gasbox.

4. The semiconductor processing chamber of claim 1, wherein an inlet aperture through the gasbox is fluidly coupled with one or more conductance paths defined within the gasbox and extending from the inlet aperture through the gasbox to the annular channel.

5. The semiconductor processing chamber of claim 4, wherein the one or more conductance paths comprise a recursive path extending radially outward to the annular channel.

6. The semiconductor processing chamber of claim 1, wherein the gasbox defines a cooling channel in the first surface of the gasbox extending about the central aperture through the gasbox.

7. The semiconductor processing chamber of claim 6, wherein the annular channel is defined within the gasbox between the cooling channel and the second surface of the gasbox.

8. The semiconductor processing chamber of claim 1, further comprising:
an insulator seated on the first surface of the gasbox and providing fluid access to the central aperture, wherein the annular channel is formed radially outward of an outer edge of the insulator.

9. A semiconductor processing chamber comprising:
a substrate support positioned within a processing region of the semiconductor processing chamber;
a gasbox characterized by a first surface and a second surface opposite the first surface, wherein the gasbox defines a central aperture, wherein the gasbox defines an annular channel extending about the central aperture, wherein the annular channel is fluidly accessible from the first surface of the gasbox, wherein the gasbox defines a spacer within the annular channel separating the annular channel into a first zone and a second zone radially outward of the first zone, wherein the gasbox further defines a plurality of outlet apertures extending from the annular channel through the second surface of the gasbox, the plurality of outlet apertures comprising a first set of outlet apertures providing fluid access from the first zone of the annular channel and a second set of outlet apertures radially outward of the first set of outlet apertures providing fluid access from the second zone of the annular channel, wherein the gasbox defines a cooling channel in the first surface of the gasbox extending about the central aperture through the gasbox, and wherein the annular channel is defined within the gasbox between the cooling channel and the second surface of the gasbox;

a blocker plate positioned between the gasbox and the substrate support; and a faceplate positioned between the blocker plate and the substrate support.

10. The semiconductor processing chamber of claim 8, wherein the spacer projects away from a surface of the annular channel in which the plurality of outlet apertures are defined.

11. The semiconductor processing chamber of claim 9, further comprising:

an insulator seated on the first surface of the gasbox and providing fluid access to the central aperture, wherein the annular channel is formed radially outward of an outer edge of the insulator.

* * * * *